US008894876B2

(12) United States Patent
Lee et al.

(10) Patent No.: US 8,894,876 B2
(45) Date of Patent: Nov. 25, 2014

(54) ETCHANT FOR ELECTRODE AND METHOD OF FABRICATING THIN FILM TRANSISTOR ARRAY PANEL USING THE SAME

(75) Inventors: Byeong-Jin Lee, Yongin-si (KR);
Hong-Sick Park, Suwon-si (KR);
Tai-Hyung Rhee, Daejeon (KR);
Yong-Sung Song, Daejeon (KR);
Choung-Woo Park, Daejeon (KR);
Jong-Hyun Oh, Boryeong-si (KR)

(73) Assignees: Samsung Display Co., Ltd. (KR);
Soulbrain Co., Ltd. (KR)

( * ) Notice: Subject to any disclaimer, the term of this patent is extended or adjusted under 35 U.S.C. 154(b) by 373 days.

(21) Appl. No.: 12/857,959

(22) Filed: Aug. 17, 2010

(65) Prior Publication Data
US 2011/0256712 A1 Oct. 20, 2011

(30) Foreign Application Priority Data

Apr. 20, 2010 (KR) ........................ 10-2010-0036364

(51) Int. Cl.
*C09K 13/00* (2006.01)
*C09K 13/10* (2006.01)
*C23F 1/10* (2006.01)
*C23F 1/44* (2006.01)
*H01L 21/3213* (2006.01)
*H01L 27/12* (2006.01)
*H01L 29/49* (2006.01)

(52) U.S. Cl.
CPC . *C09K 13/10* (2013.01); *C23F 1/10* (2013.01);
*C23F 1/44* (2013.01); *H01L 21/32134* (2013.01); *H01L 27/1259* (2013.01); *H01L 29/4908* (2013.01); *H01L 27/124* (2013.01)
USPC .......................................... 252/79.1; 252/79.3

(58) Field of Classification Search
CPC ............... H01L 21/32134; H01L 21/30604;
H01L 29/4908; H01L 27/1259; C23F 1/10;
C23F 1/44; C09K 13/10
USPC .............. 148/247; 216/13; 252/79.1; 257/59,
257/741; 349/43; 438/158, 652, 687, 738,
438/745, 754; 510/175
See application file for complete search history.

(56) References Cited

U.S. PATENT DOCUMENTS 4,220,706 A * 9/1980 Spak ............................ 430/318
6,780,784 B2 8/2004 Jo et al.
(Continued)

FOREIGN PATENT DOCUMENTS

JP 2000064067 2/2000
JP 2002194574 A 7/2002
(Continued)

OTHER PUBLICATIONS

Machine translation of JP 2009-076910 pulled Mar. 21, 2012.*

*Primary Examiner* — Duy Deo
*Assistant Examiner* — Erin Bergner
(74) *Attorney, Agent, or Firm* — Cantor Colburn LLP

(57) ABSTRACT

The present invention relates to an etchant for etching metal wiring, and the metal wiring etchant according to the present invention includes hydrogen peroxide at about 5 wt % to about 15 wt %, an oxidant at about 0.5 wt % to about 5 wt %, a fluoride-based compound at about 0.1 wt % to about 1 wt %, a nitrate-based compound at about 0.5 wt % to about 5 wt %, and a boron-based compound at about 0.05 wt % to about 1 wt %.

8 Claims, 12 Drawing Sheets

(56) References Cited

U.S. PATENT DOCUMENTS

| | | | |
|---|---|---|---|
| 6,881,679 B2 * | 4/2005 | Jo et al. ............... | 438/745 |
| 7,416,681 B2 | 8/2008 | Kim et al. | |
| 2002/0076930 A1 * | 6/2002 | Jo et al. ............... | 438/689 |
| 2002/0081847 A1 * | 6/2002 | Jo et al. ............... | 438/689 |
| 2008/0041813 A1 | 2/2008 | Oladeji et al. | |
| 2008/0067148 A1 * | 3/2008 | Liu et al. ............... | 216/83 |

FOREIGN PATENT DOCUMENTS

| | | | |
|---|---|---|---|
| JP | 2002302780 A | 10/2002 | |
| JP | 3400558 | 2/2003 | |
| JP | 2008053374 A | 3/2008 | |
| JP | 2009-076910 | * 4/2009 | ............ H01L 21/308 |
| JP | 2009091656 | 4/2009 | |
| JP | 2009515055 A | 4/2009 | |
| JP | 2009149971 | 7/2009 | |
| KR | 10-2003-0058789 | 7/2003 | |
| KR | 100415261 | 1/2004 | |
| KR | 10-2006-0082270 | 7/2006 | |
| KR | 100619449 | 8/2006 | |
| KR | 1020060099089 | 9/2006 | |
| KR | 1020070055259 | 5/2007 | |
| KR | 1020080015027 | 2/2008 | |
| KR | 1020080024817 | 3/2008 | |
| KR | 1020080024818 | 3/2008 | |
| KR | 1020090014474 | 2/2009 | |
| KR | 1020090014750 | 2/2009 | |
| KR | 1020090049365 | 5/2009 | |
| KR | 1020090079436 | 7/2009 | |
| KR | 1020090081545 | 7/2009 | |
| KR | 1020090085215 | 8/2009 | |
| KR | 1020090086694 | 8/2009 | |
| KR | 1020090087210 | 8/2009 | |
| KR | 10-2010-0001623 | 1/2010 | |
| KR | 10-2010-0001624 | 1/2010 | |
| KR | 10-2010-0001625 | 1/2010 | |
| KR | 10-2010-0027512 | 3/2010 | |
| KR | 10-2010-0035250 | 4/2010 | |
| KR | 10-2010-0040352 | 4/2010 | |
| KR | 10-2010-0049960 | 5/2010 | |
| KR | 10-2010-0082094 | 7/2010 | |
| KR | 10-2010-0090535 | 8/2010 | |
| KR | 10-2010-0090538 | 8/2010 | |
| WO | 2007020206 A1 | 2/2007 | |
| WO | 2007111694 A2 | 10/2007 | |
| WO | 2009081884 A1 | 7/2009 | |

* cited by examiner ical layer is used as a lower
ETCHANT FOR ELECTRODE AND METHOD OF FABRICATING THIN FILM TRANSISTOR ARRAY PANEL USING THE SAME This application claims priority to Korean Patent Application No. 10-2010-0036364, filed on Apr. 20, 2010, and all the benefits accruing therefrom under 35 U.S.C. §119, the content of which is herein incorporated by reference.

BACKGROUND OF THE INVENTION (a) Field of the Invention

The present invention relates to an etchant and a manufacturing method of a thin film transistor ("TFT") array panel using the same.

(b) Description of the Related Art

To form metal wiring in a substrate in a display device such as a liquid crystal display ("LCD"), a metal layer is generally formed by sputtering on a substrate, a photoresist is coated and exposed on the metal layer, and the metal layer is etched using the photoresist such that the metal layer is selectively maintained on only a predetermined region to form the metal wiring.

Here, the resistance of the type of metal used in forming the metal layer is an important factor in generating a resistor-capacitor ("RC") signal delay, and a technique for using metal wiring having low resistance has been developed.

Recently, copper (Cu), which has relatively low resistance and has relatively little negative environmental impact is increasingly gaining attention as a wiring material for low resistance applications, however copper has poor adherence with a glass substrate or a silicon insulating layer such that it is difficult to use as a single layer. To solve this problem, a multilayer including a copper alloy layer, a titanium (Ti) layer, a titanium alloy layer, a molybdenum (Mo) layer, or a molybdenum alloy layer having excellent adherence with a glass substrate or a silicon insulating layer is used as a lower layer below the copper layer.

To etch this multilayer, a peroxide-based etchant is typically used, and if the peroxide-based etchant includes metal ions at more than a predetermined concentration, peroxide decomposition is accelerated and is quickly decomposed into water and oxygen such that heat and a quick composition change may be undesirably generated, thereby generating instability.

BRIEF SUMMARY OF THE INVENTION

The present invention is capable of grossly etching a multilayer including a copper layer and another metal layer through a low content of hydrogen peroxide, and improves stability and a treatment number capacity through an etchant composition having an appropriate etching speed for a particular process, an appropriate etching amount, and an appropriate taper angle compared with a conventional peroxide-based etchant.

To solve the above-noted problems of the prior art, an exemplary embodiment of an etchant composition for metal wiring according to the present invention includes hydrogen peroxide at about 5 wt % to 15 wt %, an oxidant at about 0.5 wt % to about 5 wt %, a fluoride-based compound at about 0.1 wt % to about 1 wt %, a nitrate-based compound at about 0.5 wt % to about 5 wt %, and a boron-based compound at about 0.05 wt % to about 1 wt %.

In one exemplary embodiment, the metal wiring may be a copper layer, a copper alloy layer, a titanium layer, a titanium alloy layer, a molybdenum layer, a molybdenum alloy layer, or a multilayer thereof, and in the exemplary embodiment wherein the metal wiring is the multilayer, it may include a first layer including copper and a second layer including titanium or molybdenum.

In one exemplary embodiment, the oxidant may include potassium hydrogen sulfate, sodium nitrate, ammonium sulfate, sodium sulfate, sodium hydrogen sulfate, or a combination thereof.

In one exemplary embodiment, the fluoride-based compound may include acidic ammonium fluoride, fluorosilicic acid, potassium hydrogen fluoride, or a combination thereof.

In one exemplary embodiment, the nitrate-based compound may include nitric acid, potassium nitrate, ammonium nitrate, sodium nitrate, or a combination thereof.

In one exemplary embodiment, the boron-based compound may include boric acid, borate, boron oxide, borazole, or a combination thereof.

In one exemplary embodiment, the etchant composition may further include a chelating agent at about 0.1 wt % to about 5 wt %.

In one exemplary embodiment, the chelating agent may include an organic chelating agent including an amino group and a carboxyl group.

In one exemplary embodiment, the chelating agent may include ethylenediaminetetraacetic acid ("EDTA"), iminodiacetic acid, nitrilotriacetic acid, diethylene trinitrilo pentaacetic acid ("DTPA"), or a combination thereof.

In one exemplary embodiment, the etchant composition may further include an additive at 0.1 wt % to about 5 wt %.

In one exemplary embodiment, the additive may include 5-aminotetrazole, 1,2,3-benzotrazole, methylbenzotriazole, imidazole, peroxide stabilize agent, or a combination thereof as the azole-based compound.

An exemplary embodiment of a manufacturing method of a thin film transistor array panel according to the present invention includes: providing a gate line including a gate electrode; providing a data line insulated from the gate line; and overlapping a semiconductor with the gate electrode, wherein at least one of providing the gate line and providing the data line includes depositing a multilayer which includes copper, and etching the multilayer substantially simultaneously, and wherein the simultaneous etching of the multilayer uses an etchant which includes hydrogen peroxide at about 5 wt % to about 15 wt %, an oxidant at about 0.5 wt % to about 5 wt %, a fluoride-based compound at about 0.1 wt % to about 1 wt %, a nitrate-based compound at about 0.5 wt % to about 5 wt %, and a boron-based compound at about 0.05 wt % to about 1 wt %.

In one exemplary embodiment, the metal wiring may be a copper layer, a copper alloy layer, a titanium layer, a titanium alloy layer, a molybdenum layer, a molybdenum alloy layer, or a multilayer thereof, and in the exemplary embodiment wherein the metal wiring is the multilayer, it may include a first layer including copper and a second layer including at least one of titanium and molybdenum.

In one exemplary embodiment, the oxidant may include potassium hydrogen sulfate, sodium nitrate, ammonium sulfate, sodium sulfate, sodium hydrogen sulfate, or a combination thereof.

In one exemplary embodiment, the fluoride-based compound may include acidic ammonium fluoride, fluorosilicic acid, potassium hydrogen fluoride, or a combination thereof.

In one exemplary embodiment, the nitrate-based compound may include nitric acid, potassium nitrate, ammonium nitrate, sodium nitrate, or a combination thereof.

In one exemplary embodiment, the boron-based compound may include boric acid, borate, boron oxide, borazole, or a combination thereof.

In one exemplary embodiment, the etchant composition may further include a chelating agent at about 0.1 wt % to about 5 wt %.

In one exemplary embodiment, the chelating agent may include an organic chelating agent including an amino group and a carboxyl group, and the chelating agent may include "EDTA", iminodiacetic acid, nitrilotriacetic acid, DTPA, or a combination thereof.

In one exemplary embodiment, the etchant composition may further include an additive at about 0.1 wt % to about 5 wt %, and the additive may include 5-aminotetrazole, 1,2,3-benzotrazole, methylbenzotriazole, imidazole, peroxide stabilize agent, or a combination thereof as the azole-based compound.

In one exemplary embodiment, the etchant according to the present invention may uniformly etch a copper (Cu) layer, a copper (Cu) alloy layer, a titanium (Ti) layer, a titanium (Ti) alloy layer, a molybdenum (Mo) layer, a molybdenum (Mo) alloy layer, or a multilayer thereof, the content of hydrogen peroxide is decreased thereby increasing the margin of the process, and the thermal and the quick composition change may be suppressed thereby obtaining stability such that the treatment number capacity may be improved.

BRIEF DESCRIPTION OF THE DRAWINGS

The above and other aspects, advantages and features of this disclosure will become more apparent by describing in further detail exemplary embodiments thereof with reference to the accompanying drawings, in which.

DETAILED DESCRIPTION OF THE INVENTION

Figure 1:
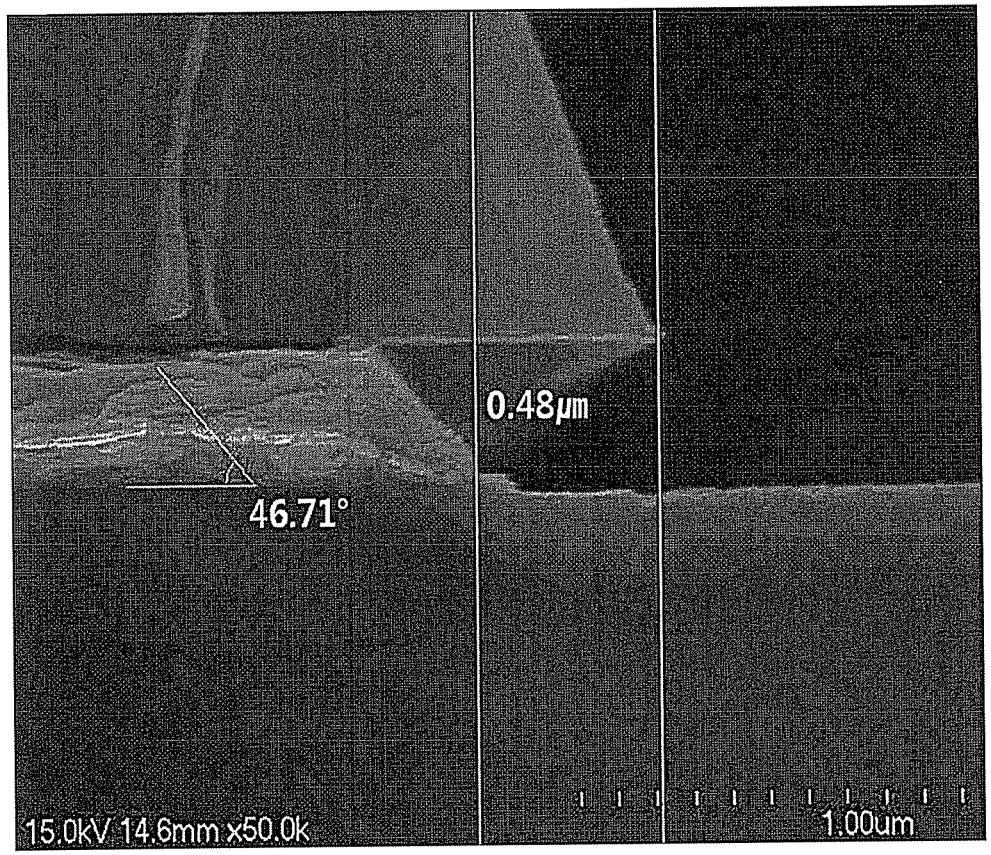
FIG. 1 is a picture showing a profile of an etching area through an electron microscope after etching a titanium layer/copper layer using a first exemplary embodiment of an etchant according to the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the present invention will be described in detail with reference to the accompanying drawings. As those skilled in the art would realize, the described embodiments may be modified in various different ways, all without departing from the spirit or scope of the present invention.

Hereinafter, eight (8) examples in which compositional ratios are controlled will be described. The eight examples were then evaluated to determine which of the eight had the best etching characteristics.

First, the compositional ratio of each exemplary embodiment will be described below.

<Exemplary Embodiment 1>

The etchant composition of Exemplary Embodiment 1 is manufactured by mixing about 10 wt % of hydrogen peroxide, about 2 wt % of an oxidant, about 0.5 wt % of a fluoride-based compound, about 1 wt % of a chelating agent, about 1 wt % of a nitrate-based compound, about 0.1 wt % of a boron-based compound, about 0.3 wt % of an additive, and the remainder to 100 wt % of deionized water.

The constitutional components and contents of the etchant are described in the following Table 1.

<Exemplary Embodiments 2 to 4>

Exemplary Embodiments 2 to 4 have substantially the same materials as Exemplary Embodiment 1, but as described in the following Table 1, have different contents thereof.

That is, the etchant composition of Exemplary Embodiment 2 is manufactured by mixing about 6 wt % of hydrogen peroxide, about 1 wt % of an oxidant, about 0.2 wt % of a fluoride-based compound, about 1 wt % of a chelating agent, about 0.5 wt % of a nitrate-based compound, about 0.1 wt % of a boron-based compound, about 0.1 wt % of an additive, and the remainder to 100 wt % of deionized water.

The etchant composition of Exemplary Embodiment 3 is manufactured by mixing about 8 wt % of hydrogen peroxide, about 1 wt % of an oxidant, about 0.7 wt % of a fluoride-based compound, about 1 wt % of a chelating agent, about 1 wt % of a nitrate-based compound, about 0.1 wt % of a boron-based compound, about 0.3 wt % of an additive, and the remainder to 100 wt % of deionized water.

The etchant composition of Exemplary Embodiment 4 is manufactured by mixing about 12 wt % of hydrogen peroxide, about 1 wt % of an oxidant, about 0.6 wt % of a fluoride-based compound, about 1 wt % of a chelating agent, about 3 wt % of a nitrate-based compound, about 0.1 wt % of a boron-based compound, about 0.5 wt % of an additive, and the remainder to 100 wt % of deionized water.

TABLE 1

| Etchant composition | Exemplary Embodiment 1 | Exemplary Embodiment 2 | Exemplary Embodiment 3 | Exemplary Embodiment 4 |
|---|---|---|---|---|
| hydrogen peroxide | 10 wt % | 6 wt % | 8 wt % | 12 wt % |
| oxidant | 2 wt % | 1 wt % | 1 wt % | 1 wt % |
| fluoride-based compound | 0.5 wt % | 0.2 wt % | 0.7 wt % | 0.6 wt % |
| chelating agent | 1 wt % | 1 wt % | 1 wt % | 1 wt % |
| nitrate-based compound | 1 wt % | 0.5 wt % | 1 wt % | 3 wt % |
| boron-based compound | 0.1 wt % | 0.1 wt % | 0.1 wt % | 0.1 wt % |
| additive | 0.3 wt % | 0.1 wt % | 0.3 wt % | 0.5 wt % |
| deionized water | remainder to 100 wt % | | | |

Meanwhile, the components and contents of Exemplary Embodiments 5 to 8 are described in more detail in Table 2.

<Exemplary Embodiments 5 to 8>

Exemplary Embodiments 5 to 8 have substantially the same main materials as in Exemplary Embodiment 1, but as described in the following Table 2, have different contents thereof.

That is, the etchant composition of Exemplary Embodiment 5 is manufactured by mixing about 10 wt % of hydrogen peroxide, about 2 wt % of an oxidant, about 0.05 wt % of a fluoride-based compound, about 1 wt % of a chelating agent, about 1 wt % of a nitrate-based compound, about 0.1 wt % of a boron-based compound, about 0.3 wt % of an additive, and the remainder to 100 wt % of deionized water.

The etchant composition of Exemplary Embodiment 6 is manufactured by mixing about 20 wt % of hydrogen peroxide, about 2 wt % of an oxidant, about 0.5 wt % of a fluoride-based compound, about 1 wt % of a chelating agent, about 1 wt % of a nitrate-based compound, about 0.1 wt % of a boron-based compound, about 0.2 wt % of an additive, and the remainder to 100 wt % of deionized water.

The etchant composition of Exemplary Embodiment 7 is manufactured by mixing about 3 wt % of hydrogen peroxide, about 2 wt % of an oxidant, about 0.5 wt % of a fluoride-based compound, about 0.5 wt % of a chelating agent, about 1 wt % of a nitrate-based compound, about 0.1 wt % of a boron-based compound, about 0.5 wt % of an additive, and the remainder to 100 wt % of deionized water.

The etchant composition of Exemplary Embodiment 8 is manufactured by mixing about 10 wt % of hydrogen peroxide, about 1 wt % of an oxidant, about 2.5 wt % of a fluoride-based compound, about 1 wt % of a chelating agent, about 6 wt % of a nitrate-based compound, about 0.1 wt % of a boron-based compound, about 0.5 wt % of an additive, and the remainder to 100 wt % of deionized water.

TABLE 2

| Etchant composition | Exemplary Embodiment 5 | Exemplary Embodiment 6 | Exemplary Embodiment 7 | Exemplary Embodiment 8 |
|---|---|---|---|---|
| hydrogen peroxide | 10 wt % | 20 wt % | 3 wt % | 10 wt % |
| oxidant | 2 wt % | 2 wt % | 2 wt % | 1 wt % |
| fluoride-based compound | 0.05 wt % | 0.5 wt % | 0.5 wt % | 2.5 wt % |
| chelating agent | 1 wt % | 1 wt % | 0.5 wt % | 1 wt % |
| nitrate-based compound | 1 wt % | 1 wt % | 1 wt % | 6 wt % |
| boron-based compound | 0.1 wt % | 0.1 wt % | 0.1 wt % | 0.1 wt % |
| additive | 0.3 wt % | 0.2 wt % | 0.5 wt % | 0.5 wt % |
| deionized water | | remainder to 100 wt % | | |

The metal wiring of the multi-layer was etched using the eight etchants, and the results will be described in more detail below. The multilayer that was used in the present experiment used a wiring having a dual-layered structure that included an upper layer made of a copper film and a lower layer made of a titanium film. The test results may be used in the case wherein the copper alloy film and the titanium alloy film (for example a molybdenum-titanium alloy layer) are used, and may be used in the case wherein the metal wiring of the multi-layer including the first layer includes copper and the second layer includes titanium or molybdenum.

First, the multilayer in which the titanium film and the copper film were deposited at a temperature of about 30° Celsius ("C") was etched using the etchants that were manufactured in Exemplary Embodiments 1 to 8.

Also, in the present exemplary embodiments, the gate wire and the data wire are formed of a dual layer including the copper layer and the titanium layer, and are patterned using the etchant of Exemplary Embodiments 1 to 8. In the present experimental examples, the copper layer is an upper layer, and the lower layer is the titanium layer, however the sequence thereof may be exchanged according to an exemplary embodiment.

First, an exemplary embodiment of a manufacturing method of a liquid crystal display ("LCD") used in the present experimental example will be described.

In the present experimental example, the first copper/titanium layer was deposited on a substrate, and a first photosensitive film pattern was formed on the first copper/titanium layer through a photolithography process. Next, the first copper/titanium layer was etched using the first photosensitive film pattern as a mask for the etchant according to the present invention to form a gate line in one direction and a gate electrode protruded from the gate line, and a gate insulating layer was deposited on substantially the entire surface of the substrate. Next, a semiconductor layer was deposited on substantially the entire surface including on the gate insulating layer and patterned into a predetermined region to form an active layer.

Next, the second copper/titanium layer was deposited on substantially the entire surface of the substrate, the second photosensitive film pattern was formed on the second copper/titanium layer through the photolithography process, and the second copper/titanium layer was etched using the etchant according to the present invention to form data wiring surrounding a pixel area by vertically intersecting the gate line, a source electrode protruded from the data wiring, and a drain electrode separated from the source electrode by a predetermined distance.

In one exemplary embodiment, the thicknesses of the first copper/titanium layer and the second copper/titanium layer may be different from each other. In such an exemplary embodiment, the upper copper layer may be formed with a thickness of about 3000 Å and the lower titanium layer may be formed with a thickness of about 200 Å in the first copper/titanium layer, and in the second copper/titanium layer, the upper copper layer may be formed with a thickness of about 3000 Å, and the lower titanium layer may be formed with a thickness of about 300 Å.

In the etching process, physical properties were evaluated after the etching exceeded 100% from the end point detect ("EPD") at which the underlying substrate was exposed, e.g., in an exemplary embodiment wherein the substrate is glass, the EDP occurred when the glass of the glass substrate was exposed. At this time, 100% exceeding etching was performed because the etch rate of the other metal film was relatively slow as compared to the copper film so that the tail and residue of the other metal film were sufficiently removed.

Hereinafter, the evaluation of physical properties will be described.

In the present experiment, the etching loss (also referred to as CD skew) measurement, the taper angle measurement, and the stability evaluation were performed during the evaluation of physical properties.

First, the etching loss was obtained by observing the profile of the multilayer (titanium film/copper film) on which the titanium film and copper film that were etched through the above etching method were layered using a microscope (SEM, Hitachi, Co., Ltd., S-4700) and measuring the distance between an end of the photoresist and an end of the copper film.

Meanwhile, the taper angle was measured by observing the profile of the multilayer (titanium film/copper film) on which the titanium film and copper film that were etched through the above etching method were layered using the microscope (SEM, Hitachi, Co., Ltd., S-4700) and measuring the taper angle of the etched side.

Also, the stability evaluation was obtained by agitating for about 5 minutes after manufacturing about 5 kg of the etchant and adding about 40 g of copper powder to the etchant to bring the copper ion amount to about 8000 ppm. After the passage of about 5 minutes, the etchant was left in a thermostat-equipped container at about 30° C. for about 72 hours, and the temperature was measured once per minute using a temperature recording device.

The results that were obtained by measuring the etching loss, the taper angle, and the stability using the above method with respect to Exemplary Embodiments 1 to 4 and Exemplary Embodiments 5 to 8 are described in Table 3 and Table 4, respectively.

TABLE 3

| | Etching loss (CD skew, μm) | Taper angle (°) | Stability | Note |
|---|---|---|---|---|
| Example 1 | 0.48 | 46.71 | Excellent | Excellent |
| Example 2 | 0.37 | 50.81 | Excellent | Excellent |

TABLE 3-continued

|  | Etching loss (CD skew, μm) | Taper angle (°) | Stability | Note |
|---|---|---|---|---|
| Example 3 | 0.46 | 55.43 | Excellent | Excellent |
| Example 4 | 0.44 | 48.26 | Excellent | Excellent |

TABLE 4

| Evaluation | Etching loss (CD skew, μm) | Taper angle (°) | Stability | Note |
|---|---|---|---|---|
| Example 5 | 0.34 | 53.92 | Excellent | Titanium tail, residue |
| Example 6 | 0.60 | 52.18 |  | Heat under the stability measurement |
| Example 7 | 0.25 | 48.99 | Excellent | Copper 8000 ppm Dissolution impossible |
| Example 8 | 0.37 | 69.55 | Excellent | Lower undercut generation due to Ti excessive etching |

Referring to Table 3 and Table 4 for the evaluation results, Exemplary Embodiment 1 to Exemplary Embodiment 4 for the etchant of the present invention is excellent compared to Exemplary Embodiment 5 to Exemplary Embodiment 8.

Also, a measurement images for the evaluation results of Exemplary Embodiment 1 to Exemplary Embodiment 4 are shown through FIG. 1 to FIG. 5, and measurement images for the evaluation results of Exemplary Embodiment 5 to Exemplary Embodiment 8 are shown through FIG. 6 to FIG. 10.

Figure 2:
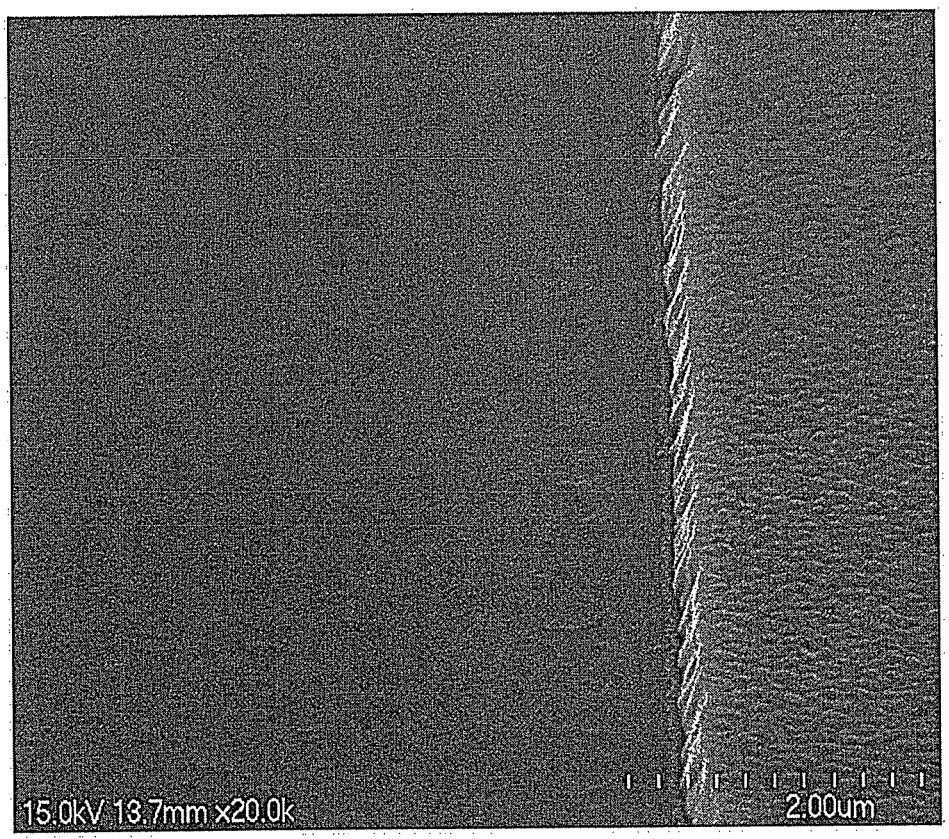
FIG. 2 is a picture showing a profile of an etching area through an electron microscope after etching a titanium layer/copper layer using the first exemplary embodiment of an etchant according to the present invention and stripping a photoresist ("PR")
Figure 3:
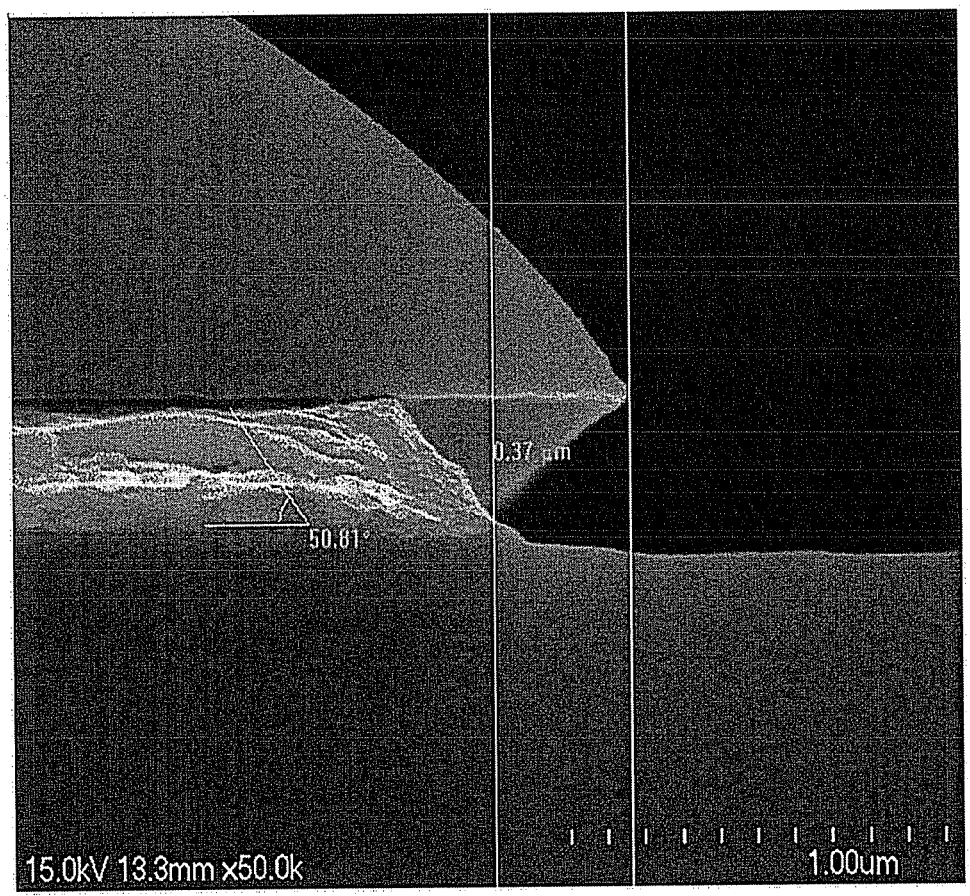
FIG. 3 is a picture showing a profile of an etching area through an electron microscope after etching a titanium layer/copper layer using a second exemplary embodiment of an etchant according to the present invention.
Figure 4:
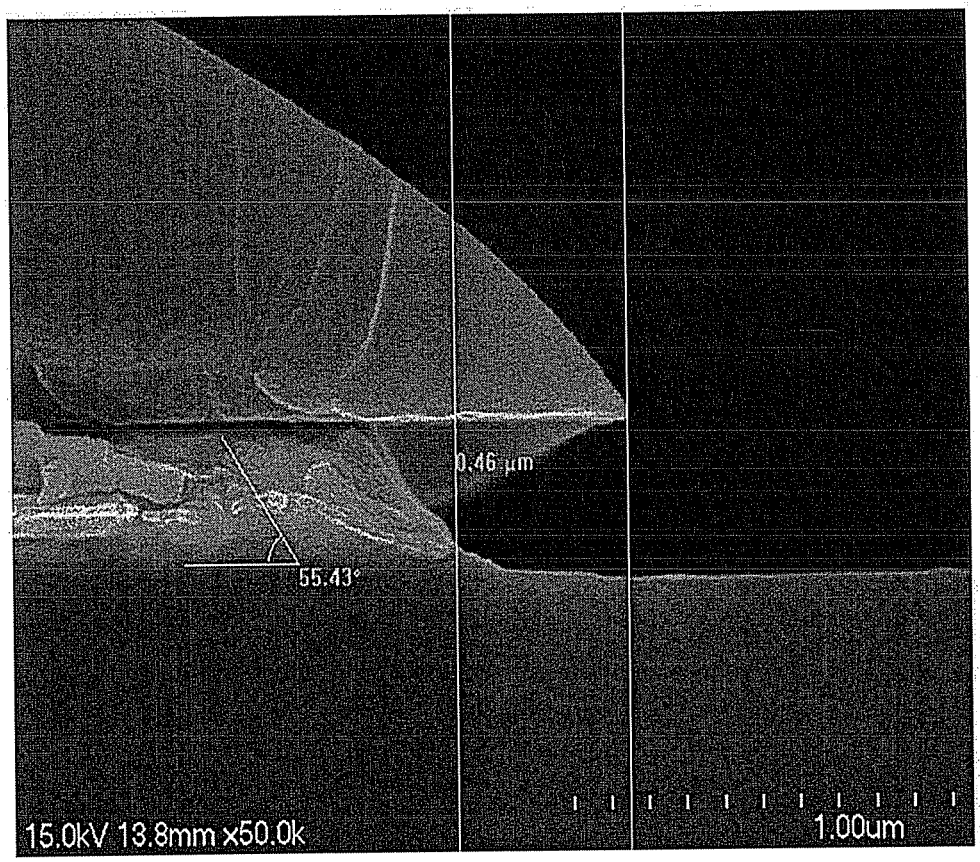
FIG. 4 is a picture showing a profile of an etching area through an electron microscope after etching a titanium layer/copper layer using a third exemplary embodiment of an etchant according to the present invention.
Figure 5:
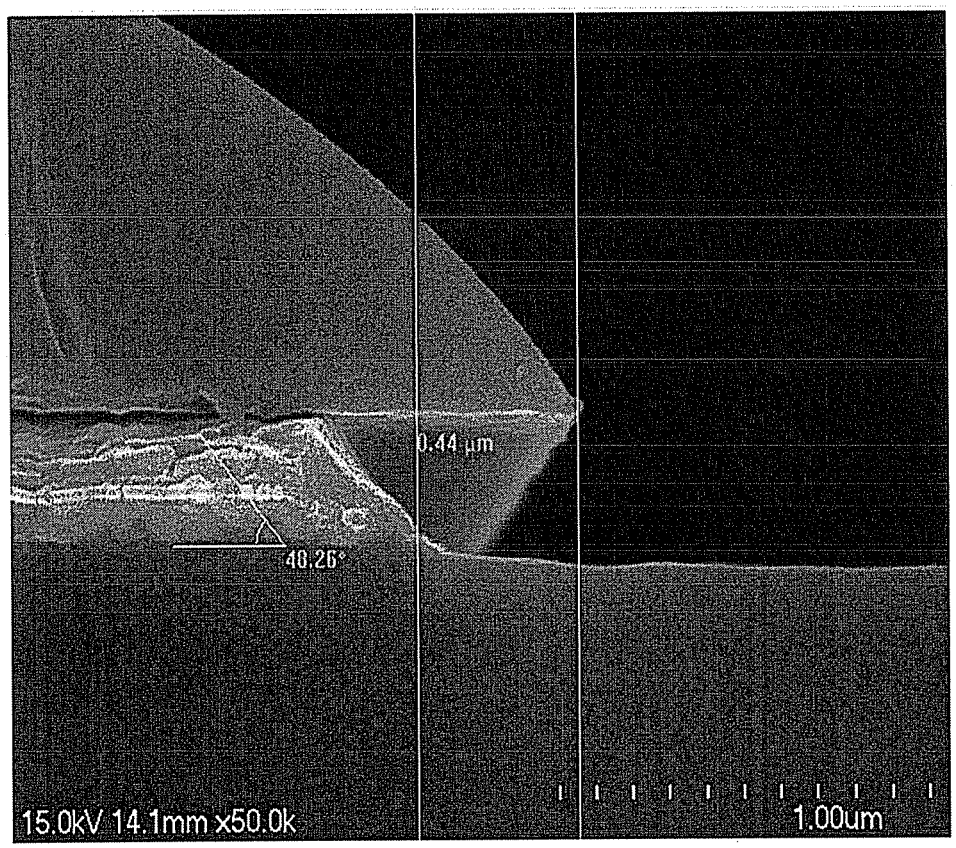
FIG. 5 is a picture showing a profile of an etching area through an electron microscope after etching a titanium layer/copper layer using a fourth exemplary embodiment of an etchant according to the present invention.

FIG. 1 is an electron microscope image showing a profile after etching a titanium layer/copper layer using an etchant according to Exemplary Embodiment 1 of the present invention, and FIG. 2 is an electron microscope image showing a profile after etching a titanium layer/copper layer using an etchant according to an Exemplary Embodiment 1 and stripping a photoresist ("PR"). In FIGS. 2 and 3, a tail and a residue of titanium are not shown. FIG. 3 is an electron microscope image showing a profile after etching a titanium layer/copper layer using an etchant according to Exemplary Embodiment 2 of the present invention, FIG. 4 is an electron microscope image showing a profile after etching a titanium layer/copper layer using an etchant according to Exemplary Embodiment 3 of the present invention, and FIG. 5 is an electron microscope image showing a profile after etching a titanium layer/copper layer using an etchant according to Exemplary Embodiment 4 of the present invention.

Figure 6:
FIG. 6 is a picture showing a profile of an etching area through an electron microscope after etching a titanium layer/copper layer using a fifth exemplary embodiment of an etchant according to the present invention.
Figure 7:
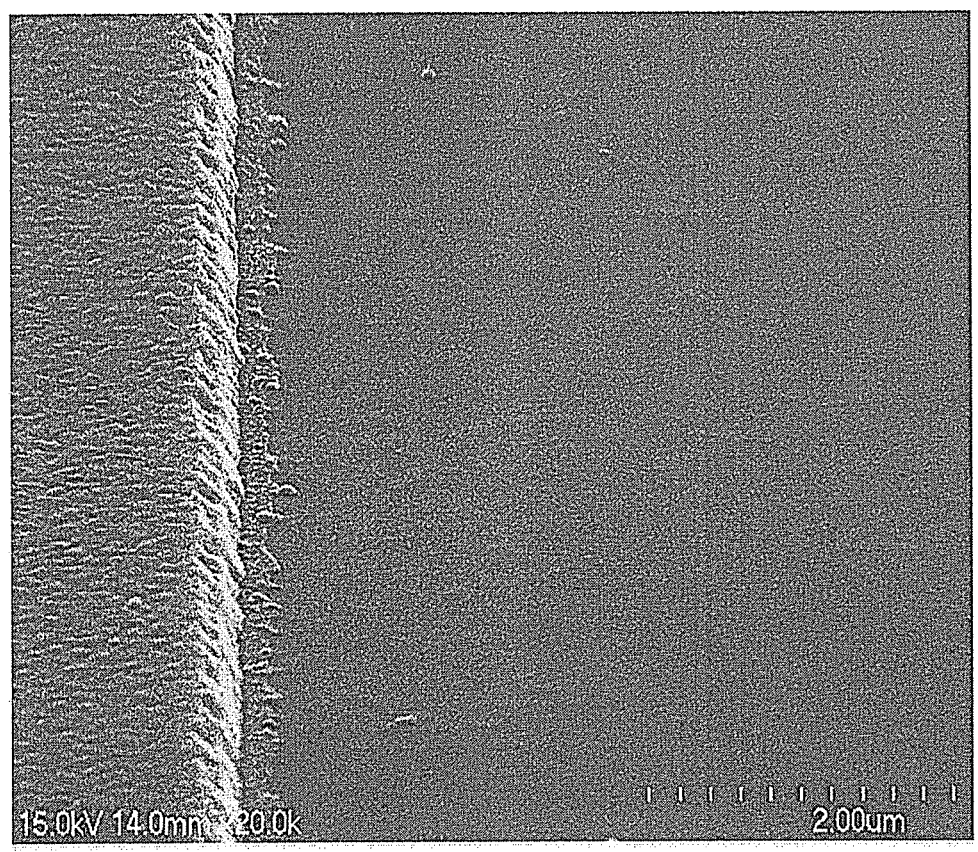
FIG. 7 is a picture showing a glass layer through an electron microscope after etching a titanium layer/copper layer using the fifth exemplary embodiment of an etchant according to the present invention and stripping a PR.

FIG. 6 is an electron microscope image showing a profile after etching a titanium layer/copper layer using an etchant according to Exemplary Embodiment 5 of the present invention, and FIG. 7 is an electron microscope image showing a glass layer after etching a titanium layer/copper layer using an etchant according to Exemplary Embodiment 5 and stripping a photoresist (PR). In FIGS. 6-7, the tail and the residue of titanium are measured.

Figure 8:
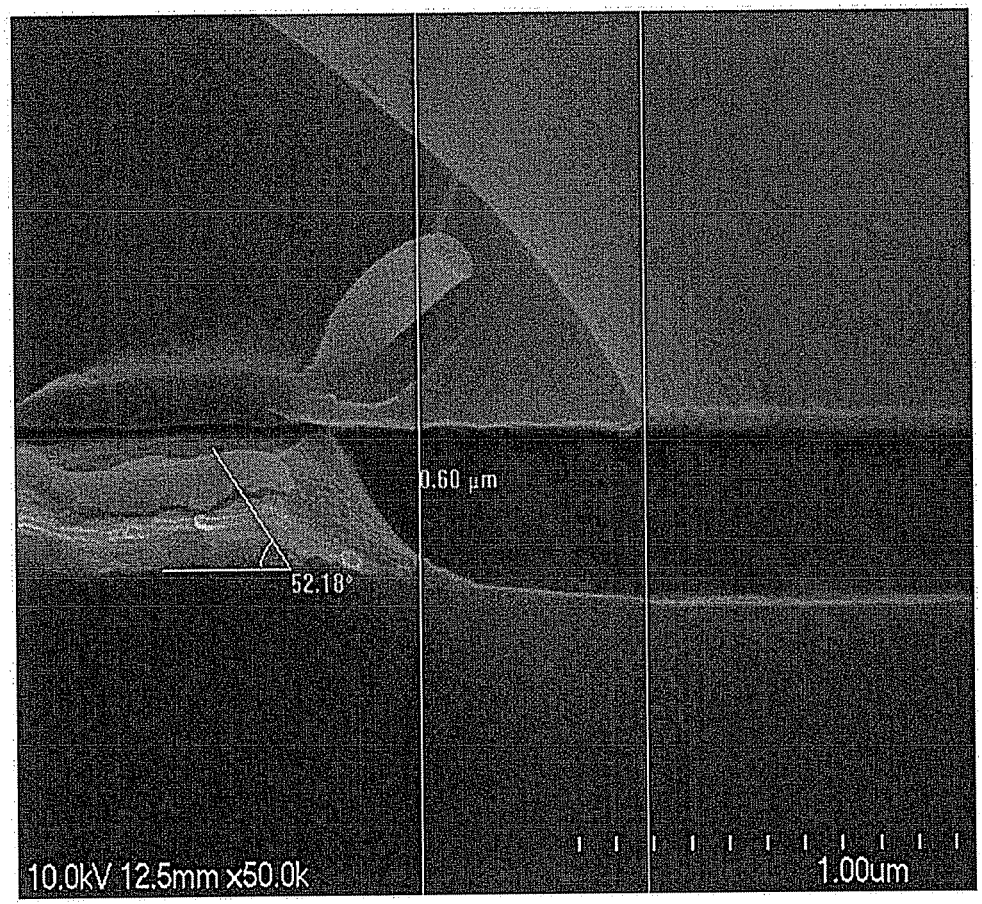
FIG. 8 is a picture showing a profile of an etching area through an electron microscope after etching a titanium layer/copper layer using a sixth exemplary embodiment of an etchant according to the present invention.
Figure 9:
FIG. 9 is a picture showing a profile of an etching area through an electron microscope after etching a titanium layer/copper layer using a seventh exemplary embodiment of an etchant according to the present invention.
Figure 10:
FIG. 10 is a picture showing a profile of an etching area through an electron microscope after etching a titanium layer/copper layer using an eight exemplary embodiment of an etchant according to the present invention.

FIG. 8 is an electron microscope image showing a profile after etching a titanium layer/copper layer using an etchant according to Exemplary Embodiment 6 of the present invention, FIG. 9 is an electron microscope image showing a profile after etching a titanium layer/copper layer using an etchant according to Exemplary Embodiment 7 of the present invention, and FIG. 10 is an electron microscope image showing a profile after etching a titanium layer/copper layer using an etchant according to Exemplary Embodiment 8 of the present invention.

In Exemplary Embodiment 1 to Exemplary embodiment 4, the etching loss is in the range of about 0.5 μm±0.2 μm, the taper angle is in the range of about 30° to about 60°, and an undesirable thermal reaction is not shown such that is the physical characteristics of the etching were evaluated to be excellent. As described above, the measuring image for each evaluation has the following correspondence; Exemplary Embodiment 1 is shown in FIG. 1 and FIG. 2, Exemplary Embodiment 2 is shown in FIG. 3, Exemplary Embodiment 3 is shown in FIG. 4, and Exemplary Embodiment 4 is shown in FIG. 5.

Exemplary Embodiment 5 includes a small amount of a fluoride-based compound compared with the etchant compositions of the other exemplary embodiments. The fluoride-based compound influences the etching of the titanium layer, the titanium alloy layer, the molybdenum layer, and the molybdenum alloy layer, and generates the titanium tail and residue in Exemplary Embodiment 5. The measuring image for Exemplary Embodiment 5 is shown in FIG. 6 and FIG. 7.

Figure 12:
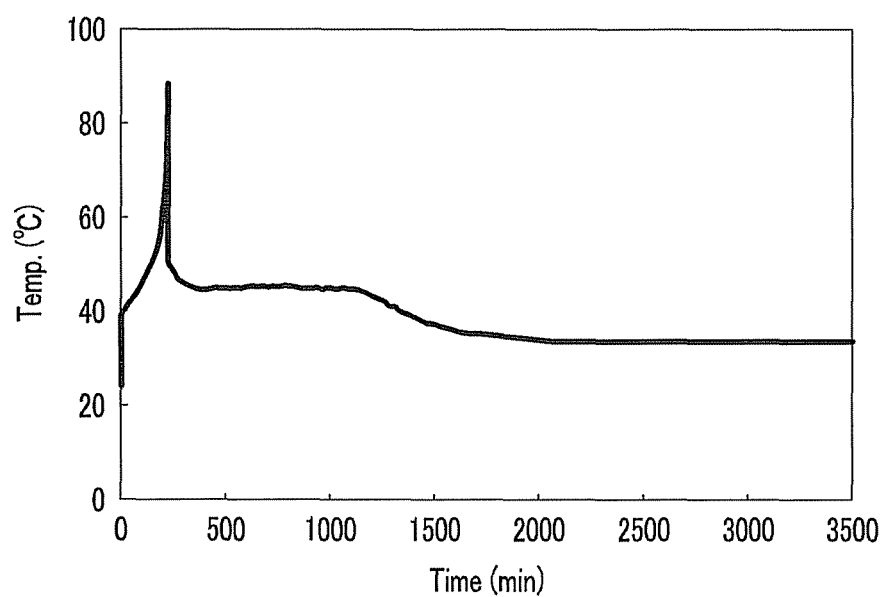
FIG. 12 is a graph showing a temperature of the sixth exemplary embodiment of an etchant according to the present invention with copper ions added at a concentration of about 8000 ppm, for about 72 hours.

Exemplary Embodiment 6 includes a relatively large amount of hydrogen peroxide compared with the etchant compositions of the other exemplary embodiments. The hydrogen peroxide oxidizes the copper, thereby forming a copper oxide, and the stability is influenced due to heat when included in a large amount. Exemplary Embodiment 6 generates the undesirable thermal reaction. The measuring image for Exemplary Embodiment 6 is shown in FIG. 8, and a measuring graph of the thermal reaction is shown in FIG. 12 and will be described later.

Exemplary Embodiment 7 includes a relatively smaller amount of hydrogen peroxide than the hydrogen peroxide of the etchant composition of the other exemplary embodiments. The hydrogen peroxide oxidizes the copper, thereby forming a copper oxide and influencing the etch speed such that the etching loss (CD skew) is small. The measuring image for Exemplary Embodiment 7 is shown in FIG. 9.

Exemplary Embodiment 8 includes a relatively large amount of the fluoride-based compound and nitric acid as compared with the other exemplary embodiments. The fluoride-based compound influences the etching of the titanium layer, the titanium alloy layer, the molybdenum layer, and the molybdenum alloy layer, while nitric acid controls the acidity of the etchant. If the acidity is not properly controlled, the etching of the copper layer, which may form the other metal layer, is not uniform. In Exemplary Embodiment 8, titanium may be over-etched thereby generating an under-cut. The measuring picture of Exemplary Embodiment 8 is shown in FIG. 10.

Next, the profile after etching the etched copper/the titanium layer using the etchant composition will be described with reference to FIG. 1, FIG. 2, FIG. 5, and FIG. 6.

That is, when comparing the images of the layers etched by the etchant composition of Exemplary Embodiment 1 of FIG. 1 and FIG. 2 and the images of the layers etched by the etchant composition of Exemplary Embodiment 5 of FIG. 5 and FIG. 6, it may be confirmed that the tail and residue of the titanium is not shown in FIG. 1 and FIG. 2 but the tail and residue of the titanium is observed in FIG. 5 and FIG. 6. Therefore, Exemplary Embodiment 1 provides advantages for the etching over the etchant of Exemplary Embodiment 5. Exemplary Embodiments 2 to 4 also do not generate the tail and residue such that they also provide advantageous etching characteristics, and Exemplary Embodiments 6 to 8 generate the tail and residue such that it may be confirmed that it is not easy to form the pattern having the desired taper angle through etching therewith.

The stability of the etchant will be described with reference to FIG. 11 and FIG. 12.

Figure 11:
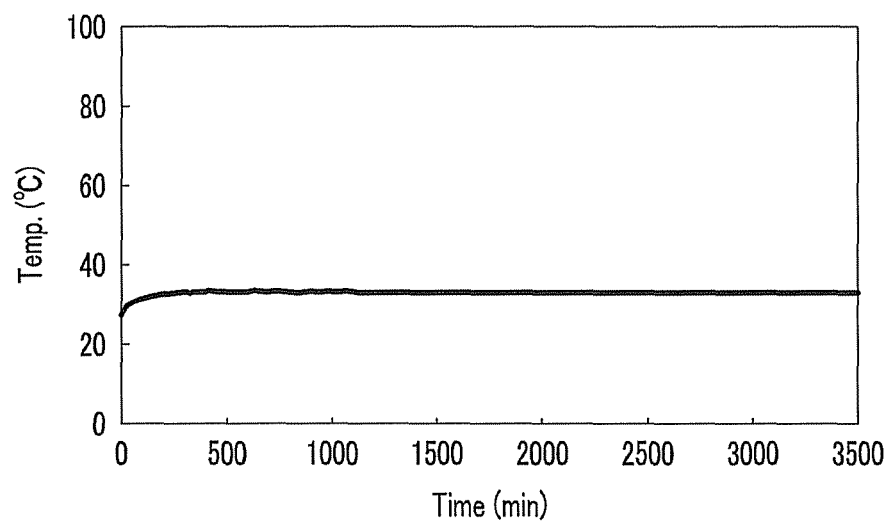
FIG. 11 is a graph showing a temperature of the first exemplary embodiment of an etchant according to the present invention with copper ions added at a concentration of about 8000 ppm, for about 72 hours.

The stability is measured through the etchant used in Exemplary Embodiment 1 and Exemplary Embodiment 6, the results thereof are shown in Table 3 and Table 4, and the temperature change graph is shown in FIG. 11 and FIG. 12.

The difference of the etchant composition between Exemplary Embodiment 1 and Exemplary Embodiment 6 is the amount of hydrogen peroxide as described above, as the composition of hydrogen peroxide of Exemplary Embodiment 6 is 20% that is a higher concentration than that of 10% in Exemplary Embodiment 1.

For the evaluation method, copper powder was dissolved in the etchant for copper ions to be included and is the combination was left for 72 hours. The characteristics of the resulting combination were measured, and as a result, if the temperature of the combination did not exceed 35° C. and the composition change was not speedily generated, the characteristics of the etchant were determined to be excellent.

The etchant used for the stability evaluation is the etchant of Exemplary Embodiment 1, and about 5 kg of the etchant was manufactured, about 40 g of the copper powder was added to the etchant until the amount of copper ions was about 8000 ppm, and the solution was stirred for about 5 minutes.

After the passage of 5 minutes, the etchant was left in the thermostat-equipped container at about 30° C. for 72 hours, and the temperature was measured once per minute using a temperature recording device.

The etchant of Exemplary Embodiment 6 was measured with the same method as Exemplary Embodiment 1.

FIG. 11 is a graph showing temperature of an etchant according to Exemplary Embodiment 1 after adding copper ions to a concentration of about 8000 ppm, for about 72 hours, and the quick thermal reaction was not generated.

FIG. 12 is a graph showing the temperature of an etchant according to Exemplary Embodiment 6 after adding copper ions to a concentration of about 8000 ppm, for about 72 hours, and the quick thermal reaction was generated.

Therefore, the etchant composition according to Exemplary Embodiment 1 is more stable than the etchant composition according to Exemplary Embodiment 6 such that it may be confirmed that Exemplary Embodiment 1 provides advantageous characteristics as compared with Exemplary Embodiment 6.

According to Table 3 and Table 4, it may be confirmed that Exemplary Embodiment 1 to 6 and Exemplary Embodiment 8 are excellent for the etch loss, the taper angle of Exemplary Embodiment 1 to 7 is excellent, and the stability is excellent in Exemplary Embodiment 1 to 5, Exemplary Embodiment 7, and Exemplary Embodiment 8.

However, titanium is not fully and normally etched in Exemplary Embodiment 5 such that the tail is generated and the residue remains (referring to FIG. 5 and FIG. 6), the stability is decreased in Exemplary Embodiment 6 (referring to FIG. 12), copper is not dissolved at a concentration of about 8000 ppm in Exemplary Embodiment 7, and titanium is overetched in Exemplary Embodiment 8 such that the layer or the substrate that is disposed under the titanium is additionally etched thereby undesirably generating the under-cut.

Therefore, the etchants of Exemplary Embodiments 1 to 4 among Exemplary Embodiments 1 to 8 are more stable and provide more advantageous etching characteristics.

Referring to Exemplary Embodiment 5 to 8, 20 wt % of hydrogen peroxide was included (referring to Exemplary Embodiment 6), 3 wt % of hydrogen peroxide was included (referring to Exemplary Embodiment 7), 0.05% of a fluoride-based compound was included (referring to Exemplary Embodiment 5), 2.5% of a fluoride-based compound was included (referring to Exemplary Embodiment 6), and 6% of a nitrate-based compound was included (referring to Exemplary Embodiment 8).

Therefore, according to the experimental examples of the present invention, it is determined that the etchant composition including hydrogen peroxide at about 5 wt % to about 15 wt %, a fluoride-based compound at about 0.1 wt % to about 1 wt %, and a nitrate-based compound at 0.5 to 5 wt % provides the most advantageous characteristics.

Also, a boron-based compound at about 0.1 wt % is included in all exemplary embodiments, however when including it at less than about 0.05 wt %, damage to the glass substrate is increased, and when including it at more than about 1 wt %, the etch speed of titanium, the titanium alloy layer, the molybdenum layer, the molybdenum alloy layer, or a multi-layer including them is remarkably deteriorated such that the residue and the tail may be generated, so to include it at about 0.05 wt % to about 1 wt % provides advantageous characteristics. In one exemplary embodiment, the boron-based compound may be included at a concentration of about 0.1 wt % to about 1 wt %.

On the other hand, an oxidant at about 0.5 wt % to about 5 wt % may be included, a chelating agent at about 0.1 wt % to about 5 wt % may be included, and an additive at about 0.1 wt % to about 5 wt % may be included. The deionized water is included for the remainder to 100 wt % in the etchant composition.

The hydrogen peroxide used in the etchant composition functions to form copper oxide $CuO_2$ by oxidizing copper, and when the content of the hydrogen peroxide for the total etchant composition is more than about 15 wt %, when etching the plurality of metal wires, stability is not obtained such that there is a limit for the number of etching treatments. On the other hand, if the content of hydrogen peroxide is less than about 5 wt %, the elapsed time and the treatment number capacity are weak such that the etching of the metal wiring is not smooth.

The oxidant used in the etchant composition may include one selected from a group of potassium hydrogen sulfate, sodium nitrate, ammonium sulfate, sodium sulfate, and sodium hydrogen sulfate. The oxidant substitutes copper oxide that is generated by hydrogen peroxide with copper nitrate ($Cu(NO_3)_2$) and copper sulfate ($CuSO_4$), and the generated compound is water-soluble and may be dissolved in the etchant composition. The oxidant may be included in the range of about 0.5-5 wt % for the total weight of the entire composition. In the case that the content of the oxidant is less than about 0.5 wt %, the etching of the copper layer, the copper alloy layer, or the multilayer including them may not be smooth, and in the case that the content of the oxidant is more than about 5 wt %, the activity of fluorine ions that are included in the fluoride-based compound is increased thereby generating damage to the glass substrate.

The fluoride-based compound used in the etchant composition is used to etch the titanium layer, the titanium alloy layer, the molybdenum layer, the molybdenum alloy layer, or the multilayer thereof, and may be at least one selected from acidic ammonium fluoride, fluorosilicic acid, and potassium hydrogen fluoride. The fluoride-based compound may be included in the range of about 0.1-1 wt % for the total weight for the entire composition. If the content thereof is more than about 1 wt %, the glass substrate or the silicon layer may be excessively etched, and if the content thereof is less than about 0.1 wt %, the etching speed is remarkably decreased such that the residue and the tail may be generated. Accordingly, the fluoride-based compound may be included in the range at which the glass substrate or the silicon layer is not etched in order to improve the quality of the etch.

In one exemplary embodiment, the chelating agent used in the etchant composition includes an organic chelating agent including an amino group and a carboxyl group. The organic chelating agent may be made of at least one of ethylenediaminetraacetic acid ("EDTA"), iminodiacetic acid, nitrilotriacetic acid, and diethylene trinitrilo pentaacetic acid ("DTPA"). When the number of etching treatments applied to the metal wiring is determined, since the amount of ions of copper or a metal is increased in the etchant solution, the chelating agent prevents a phenomenon in which the etching ability is deteriorated. The chelating agent may be included in the range of about 0.1-5 wt % for the total weight for the entire composition. If the content thereof is more than about 5 wt %, it approaches a threshold point such that the solubility becomes poor and thus it may be precipitated, and if the content thereof is less than about 0.1 wt %, when the number of treatments is increased, the etching ability may be deteriorated. Accordingly, in one exemplary embodiment the composition range is in the range of about 0.1 wt % to about 5 wt %.

The nitrate-based compound used in the etchant composition controls the acidity of the etchant, and may be one selected from a group of nitric acid, potassium nitrate, ammonium nitrate and sodium nitrate. The nitrate-based compound may be included in a range of about 0.5 wt % to about 5 wt % for the total weight of the entire composition. If the content thereof is less than about 0.5 wt % or more than about 5 wt %, the acidity is not properly controlled such that the etching of the copper layer and the different metal layer is not uniform. Thus, exemplary embodiments include compositions wherein the nitrate-based compound may be included in a range of about 0.5 wt % to about 5 wt %.

The boron-based compound used in the etchant composition suppresses damage to the glass substrate, and may be one selected from a group of boric acid, borate, boron oxide, and borazole. The boron-based compound may be included in the range of about 0.05 wt % to about 1 wt % for the total weight of the entire composition. In the case that the content thereof is less than about 0.05 wt %, the damage to the glass substrate may be increased, and if the content thereof is more than about 1 wt %, the etching speed of titanium, the titanium alloy layer, the molybdenum layer, the molybdenum alloy layer, or the multi-layer thereof may be remarkably deteriorated such that the content thereof is controlled in the range in which the residue and the tail are not generated.

The additive used in the etchant composition is not limited and may be of various types, and in one exemplary embodiment is an azole-based compound that may be used as an etching suppression agent of the copper layer. The azole-based compound may be in the range of about 0.1-5 wt % for the total weight of the entire composition, and may be used for controlling the etch speed and the etch amount of copper or copper alloy. Exemplary embodiments of the azole-based compound may be 5-aminotetrazole, 1,2,3-benzotrazole, methylbenzotriazole, and imidazole. If the content thereof is less than about 0.1 wt %, a loss by etching (also referred to as a critical dimension ("CD")) may be increased, and if the content thereof is more than about 5 wt %, the etching speed of copper or a copper alloy may be lowered, and a taper angle may become non-uniform. The remaining wt % for the entire composition in the present invention may be the amount of deionized water, and the deionized water functions to dilute the composition. Also, another exemplary embodiment of the additive may include a peroxide stabilization agent for stabilizing peroxide.

As described above, when the etching process is performed by the etchant according to the present invention, the etching may be efficiently performed so that the loss by the etching is about 1.0 μm or less and the taper angle is about 30° or more.

An etchant composition of Exemplary Embodiment 9 is provided as in Table 5 based on the above-described contents. The etchant composition of Exemplary Embodiment 9 is an exemplary embodiment providing advantageous results for the etching loss, the taper angle, the stability, and the etching speed.

TABLE 5

| Hydrogen peroxide | Oxidant (etching agent) | Chelating agent | Nitrate-based compound (PH controller) | Additive (Cu inhibitor) | Fluoride-based compound | Boron-based compound | Additive (peroxide stabilize agent) |
|---|---|---|---|---|---|---|---|
| 10 | 2 | 1 | 1 | 0.4 | 0.5 | 0.1 | 0.3 |

In Table 5, the units are wt %.

The exemplary embodiment according to Table 5 is manufactured according to the composition ratio of the etchant composition provided in the present invention, is only one of various exemplary embodiments, and is not limited by the above described composition ratio.

The metal layer used in the exemplary embodiment is used as the titanium layer/copper layer, however the metal layer not limited thereto. The etchant of the present invention may be used for a copper (Cu) layer, a copper (Cu) alloy layer, a titanium (Ti) layer, a titanium (Ti) alloy layer, a molybdenum (Mo) layer, a molybdenum (Mo) alloy layer, or a multilayer thereof. The principle thereof is as follows.

The copper layer and the molybdenum layer are oxidized by hydrogen peroxide, and the etching is executed by a sulfate functional group, a nitrate functional group, and a F− source as the etching agent. A reaction equation is as follows.

Oxidation: the oxidation of copper and molybdenum are activated in an anodic site.

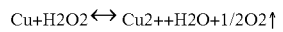

Cu+H2O2 ↔ Cu2++H2O+1/2O2↑

Mo+3H2O2 ↔ Mo6++3H2O+3/2O2↑ etching: Cu2+, Mo6+ are dissolved by F− ion.

Cu2++SO42− ↔ CuSO4 (water soluble)

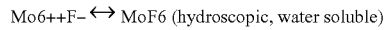

Mo6++F− ↔ MoF6 (hydroscopic, water soluble)

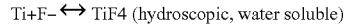

Ti+F− ↔ TiF4 (hydroscopic, water soluble)

Accordingly, as shown in the above reaction equation, the etchant of the present invention may be used for various metal layers such as the copper (Cu) layer, the copper (Cu) alloy layer, the titanium (Ti) layer, the titanium (Ti) alloy layer, the molybdenum (Mo) layer, the molybdenum (Mo) alloy layer, or the multilayer thereof.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A metal wiring etchant composition, the etchant comprising:
   hydrogen peroxide at about 6 wt % to about 12 wt %;
   an oxidant at about 1 wt % to about 2 wt %;
   a fluoride-based compound at about 0.2 wt% to about 0.7 wt %;
   a nitrate-based compound at about 0.5 wt% to about 3 wt %;
   wherein the nitrate-based compound comprises nitric acid, potassium nitrate, ammonium nitrate, sodium nitrate, or a combination comprising at least one of the foregoing
   and a boron-based compound at about 0.05 wt % to about 1 wt %; wherein the boron-based compound comprises boric acid, borate, boron oxide, borazole, or a combination comprising at least one of the foregoing; and
   wherein the metal wiring comprises at least one of a copper layer, a copper alloy layer, a titanium layer, a titanium alloy layer, a molybdenum layer, a molybdenum alloy layer, and a multilayer thereof, and wherein when the metal wiring comprises the multilayer, the metal layer comprises a first layer including copper and a second layer comprising at least one of titanium or molybdenum.

2. The etchant composition of claim 1, wherein the oxidant comprises potassium hydrogen sulfate, sodium nitrate, ammonium sulfate, sodium sulfate, sodium hydrogen sulfate, or a combination comprising at least one of the foregoing.

3. The etchant composition of claim 1, wherein the fluoride-based compound comprises acidic ammonium fluoride, fluorosilicic acid, potassium hydrogen fluoride, or a combination comprising at least one of the foregoing.

4. The etchant composition of claim 1, wherein the etchant composition further comprises a chelating agent at about 0.1 wt % to about 5 wt %.

5. The etchant composition of claim 4, wherein the chelating agent comprises an organic chelating agent including an amino group and a carboxyl group.

6. The etchant composition of claim 5, wherein the chelating agent comprises ethylenediaminetetraacetic acid, iminodiacetic acid, nitrilotriacetic acid, diethylene trinitrilo pentaacetic acid, or a combination comprising at least one of the foregoing.

7. The etchant composition of claim 1, wherein the etchant composition further comprises an additive at about 0.1 wt % to about 5 wt %.

8. The etchant composition of claim 7, wherein the additive comprises 5-aminotetrazole, 1,2,3-benzotrazole, methylbenzotriazole, imidazole, peroxide stabilize agent, or a combination comprising at least one of the foregoing additives.

* * * * *